(12) United States Patent
Lee et al.

(10) Patent No.: US 8,039,850 B2
(45) Date of Patent: Oct. 18, 2011

(54) WHITE LIGHT EMITTING DEVICE

(75) Inventors: Jeong Wook Lee, Gyunggi-do (KR);
Yong Jo Park, Gyunggi-do (KR); Cheol Soo Sone, Gyunggi-do (KR)

(73) Assignee: Samsung LED Co., Ltd., Gyunggi-Do (KR)

( * ) Notice: Subject to any disclaimer, the term of this patent is extended or adjusted under 35 U.S.C. 154(b) by 0 days.

(21) Appl. No.: 12/250,133

(22) Filed: Oct. 13, 2008

(65) Prior Publication Data
US 2009/0114929 A1    May 7, 2009

(30) Foreign Application Priority Data

Nov. 6, 2007  (KR) .................. 10-2007-0112701

(51) Int. Cl.
*H01L 29/18* (2006.01)
*H01L 33/00* (2006.01)

(52) U.S. Cl. ............... 257/88; 257/98; 257/E33.058; 257/E33.059; 257/E33.061

(58) Field of Classification Search ............ 257/88, 257/E33.057, E33.058, E33.059, E33.061, 257/E33.06, E33.064, 98, E33.001, E33.002, 257/E25.02; 438/28, 22; 362/84, 268
See application file for complete search history.

(56) References Cited

U.S. PATENT DOCUMENTS

| | | | |
|---|---|---|---|
| 7,071,493 B2 * | 7/2006 | Owen et al. ............... | 257/88 |
| 7,332,746 B1 * | 2/2008 | Takahashi et al. .......... | 257/98 |
| 7,455,423 B2 * | 11/2008 | Takenaka .................... | 362/231 |
| 7,482,633 B2 * | 1/2009 | Chiaretti .................... | 257/89 |
| 7,708,428 B2 * | 5/2010 | Park et al. .................. | 362/241 |
| 2003/0067773 A1 | 4/2003 | Marshall et al. | |
| 2003/0230970 A1 * | 12/2003 | Steckl et al. ............... | 313/498 |
| 2004/0027481 A1 | 2/2004 | Asai et al. | |
| 2004/0170018 A1 * | 9/2004 | Nawashiro .................. | 362/244 |
| 2006/0055309 A1 * | 3/2006 | Ono et al. .................. | 313/492 |
| 2006/0065957 A1 * | 3/2006 | Hanya ........................ | 257/676 |

(Continued)

FOREIGN PATENT DOCUMENTS

JP          2000-031532 A         1/2000

(Continued)

OTHER PUBLICATIONS

Japanese Office Action, w/ English translation thereof, issued in Japanese Patent Application No. 2008-271350, dated Jul. 26, 2011.

*Primary Examiner* — Matthew Landau
*Assistant Examiner* — Latanya N Crawford
(74) *Attorney, Agent, or Firm* — McDermott Will & Emery LLP

(57) ABSTRACT

There is provided a white light emitting device that prevents a red phosphor from resorbing wavelength-converted light to improve white luminous efficiency. A white light emitting device according to an aspect of the invention includes a package body; at least two LED chips mounted to the package body and emitting excitation light; and a molding unit including phosphors, absorbing the excitation light and emitting wavelength-converted light, in regions of the molding unit divided according to the LED chips and molding the LED chips. According to the aspect of the invention, since the phosphor for converted red light can be prevented from resorbing light generated from other regions of the molding unit, the white light emitting device that can improve white luminous efficiency or control color rendering and color temperature by adjusting a mixing ratio of converted light for white light emission.

8 Claims, 3 Drawing Sheets

U.S. PATENT DOCUMENTS

| | | | |
|---|---|---|---|
| 2006/0138435 A1* | 6/2006 | Tarsa et al. | 257/89 |
| 2006/0245188 A1* | 11/2006 | Takenaka | 362/231 |
| 2007/0064420 A1* | 3/2007 | Ng et al. | 362/231 |
| 2007/0274069 A1* | 11/2007 | Chou | 362/244 |
| 2007/0284563 A1* | 12/2007 | Lee et al. | 257/13 |
| 2008/0006837 A1* | 1/2008 | Park et al. | 257/98 |
| 2008/0042151 A1* | 2/2008 | Oh et al. | 257/88 |
| 2008/0144322 A1* | 6/2008 | Norfidathul et al. | 362/310 |
| 2009/0039376 A1* | 2/2009 | Uemoto et al. | 257/99 |
| 2009/0103296 A1* | 4/2009 | Harbers et al. | 362/234 |
| 2009/0146158 A1* | 6/2009 | Park | 257/89 |
| 2009/0160330 A1* | 6/2009 | Hsu et al. | 313/506 |
| 2009/0180273 A1* | 7/2009 | Kim et al. | 362/84 |
| 2009/0262516 A1* | 10/2009 | Li | 362/84 |
| 2009/0294780 A1* | 12/2009 | Chou et al. | 257/88 |

FOREIGN PATENT DOCUMENTS

| | | |
|---|---|---|
| JP | 2004-71807 A | 3/2004 |
| JP | 2005-167138 A | 6/2005 |
| JP | 2006-120748 A | 5/2006 |
| JP | 2006-245443 | 9/2006 |
| JP | 2008-235500 A | 10/2008 |
| KR | 10-0726137 B1 | 6/2007 |

* cited by examiner

WHITE LIGHT EMITTING DEVICE

CROSS-REFERENCE TO RELATED APPLICATIONS

This application claims the priority of Korean Patent Application No. 2007-0112701 filed on Nov. 6, 2007, in the Korean Intellectual Property Office, the disclosure of which is incorporated herein by reference.

BACKGROUND OF THE INVENTION

1. Field of the Invention

The present invention relates to a white light emitting device, and more particularly, to a white light emitting device that prevents a red phosphor from resorbing wavelength-converted light to improve white luminous efficiency.

2. Description of the Related Art

In general, a white light emitting diode (hereinafter, referred to as an "LED") is a semiconductor device package that displays white by forming a light source using a compound semiconductor materials, such as GaAs, AlGaAs, GaN, InGan, and AlGaInP.

In general, specifications that determine characteristics of the LED package include color, luminescence, a range of the intensity of luminescence, and the like. The characteristics of the LED package are primarily determined by compound semiconductor materials of the LED used in the LED package. Secondarily, the characteristics of the LED package are affected by a structure of the package used to mount an LED chip. In order to obtain high luminescence and luminescence distribution according to user's needs, the above-described primary factor, such as material development, has limits. Therefore, the package structure has received attention.

In particular, with the reduction in size, thickness, and weight of information and communication devices, components of the information and communication devices, for example, resistors, condensers, and noise filters, are increasingly reduced in size. Further, the components are directly mounted onto the surface of a PCB (printed circuit board), and devices so made are called surface mount devices (SMDs).

An LED package that is used as a display device is developed into an SMD LED package. This SMD LED package can replace the existing lighting lamp and is used as a character indicator, an image indicator, and a lighting indicator, which displays various colors.

As such, as the LED package is used in a wide range of applications, the amount of luminescence required for lamps for daily use or emergency signal lamps is increasing more and more. Recently, a high power white LED package has come into widespread use.

FIG. 1 is a view illustrating an example of a white LED package according to the related art.

As shown in FIG. 1, in an LED package according to the related, a reflection hole is formed in a PCB 20 so that an LED 21 is mounted in the reflection hole, a reflective coating layer 20-1 formed of Ag is formed inside the reflection hole, and the reflective coating layer 20-1 is connected to package electrodes 22 and 23 to apply power to the LED 21.

When the reflective coating layer 20-1 is formed on the PCB 20, the LED 21 is formed at a lower part of the reflection hole, and a P electrode and an N electrode of the LED 21 are electrically connected to the reflective coating layer 20-1.

When the LED 21 is mounted in the reflection hole, a cathode electrode 22 and an anode electrode 23 are formed at both sides of the reflective coating layer 20-1 by a solder bonding method. Then, a phosphor molding unit 24 that includes a red phosphor, a green phosphor, and a blue phosphor is injected into the reflection hole of the PCB 20 mounted with the LED 21 to inhibit oxidization and convert light generated from the LED 21 into white light.

The LED package then converts light generated from the LED 21 into white light in the phosphor molding unit 24 and emits the white light to the outside by a mold lens 25.

However, in the above assembled white LED package according to the related art, when the red phosphor, the blue phosphor, and the green phosphor that are mixed in the phosphor molding unit 24 absorb the light generated from the LED 21 and convert the light into light having corresponding wavelength to obtain white light emission, the red phosphor resorbs light of which wavelength is converted by the blue phosphor and the green phosphor, and thus luminous efficiency of white light emitted by the LED package is reduced.

SUMMARY OF THE INVENTION

An aspect of the present invention provides a white light emitting device that prevents a red phosphor from resorbing light having a wavelength converted by a blue phosphor and a green phosphor to improve white luminous efficiency.

An aspect of the present invention also provides a white light emitting device including: a package body; at least two LED chips mounted to the package body and emitting excitation light; and a molding unit including phosphors, absorbing the excitation light and emitting wavelength-converted light, in regions of the molding unit divided according to the LED chips and molding the LED chips.

The white light emitting device may further include: a mold lens unit, above the molding unit, scattering the wavelength-converted light to emit the scattered light to the outside; and a reflective film formed of high-reflectivity metal at the boundary of the regions of the molding unit.

At least one of the regions of the molding unit may include a phosphor for converted red light, and the phosphor for the converted red right is a rare earth oxide, sulfide, or nitride-based phosphor that is any one selected from the group consisting of aAlSiN$_3$:Eu$^{2+}$, (Sr$_X$,Ca$_{1-x}$)AlSiN$_3$:Eu$^{2+}$(0≦x≦1), Sr$_3$SiO$_5$:Eu$^{2+}$, (Sr$_X$,Ca$_{1-x}$)$_2$SiO$_4$:Eu$^{2+}$, (Sr$_X$,Ca$_{1-x}$)AlSi N$_y$O$_{1-y}$(0≦x≦1) MS:Eu$^{2+}$(M=Ca,Sr,Ba), M$_2$O$_{3-x}$S$_x$:Eu$^{3+}$ (1≦x≦3, M=Y,Gd,La), (Y,Lu,Sc,La,Gd,Sm)$_3$(Al,Ga,In)$_5$)$_{12}$:Ce, and (Y,Ca,Sr)$_3$(Al,Ga,Si)$_5$(O,S)$_{12}$:(Ce, Tb), or a combination thereof.

At least one of the regions of the molding unit may include a phosphor for converted red light, and the phosphor for the converted red light is a semiconductor nitride, sulfide, oxide, or phosphide-based phosphor that is any one selected from the group consisting of Zn$_{1-x}$Cd$_x$S$_y$Se$_{1-y}$(0≦x≦1, 0≦y≦1), Zn$_{1-x}$Cd$_x$S$_y$O$_{1-y}$(0≦x≦1, 0≦y≦1), Al$_{1-x-y}$Ga$_x$In$_y$N (0≦x≦1, 0≦y≦1), and Al$_{1-x-y}$Ga$_x$In$_y$P(0≦x≦1, 0≦y≦1), or a combination thereof.

The molding unit may include a first molding unit including a phosphor for converted red light and a second molding unit including phosphors for converted blue light and converted green light.

Each of the molding units may include a plurality of molding regions individually including the phosphors, and the phosphor included in at least one of the plurality of molding regions may be a phosphor for converted red light.

The mold lens unit may include a plurality of optically transparent scatterers scattering the wavelength-converted light, and the scatterer may be any one material selected from the group consisting of optical glass, silica, talc, zirconium, a zinc oxide, and a titanium dioxide, or a combination thereof.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1:
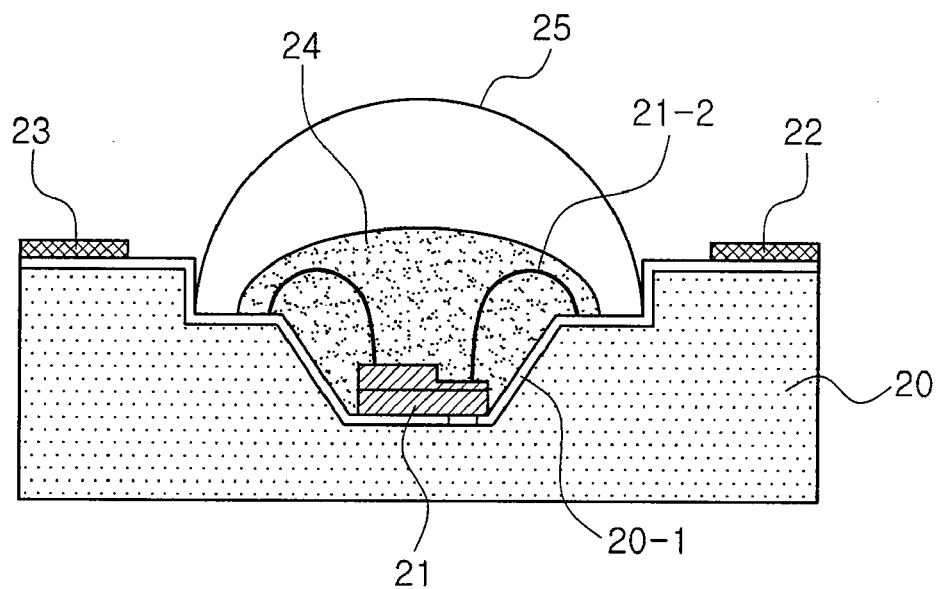
FIG. 1 is an exemplary view illustrating a white LED package according to the related art.
Figure 2A:
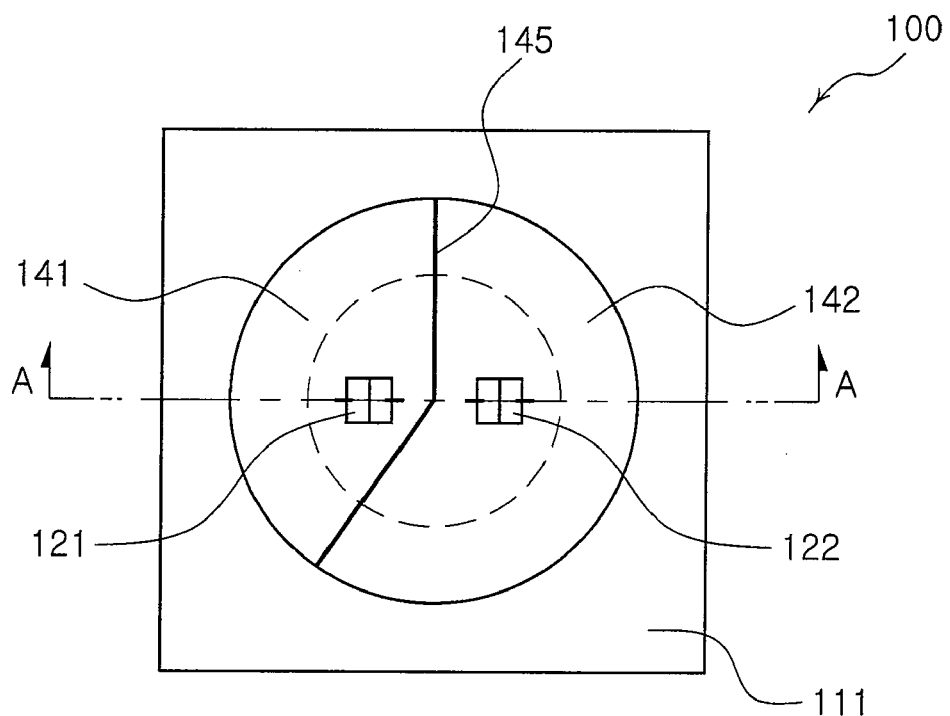
FIG. 2A is a plane view illustrating a white light emitting device according to a first exemplary embodiment of the present invention.
Figure 2B:
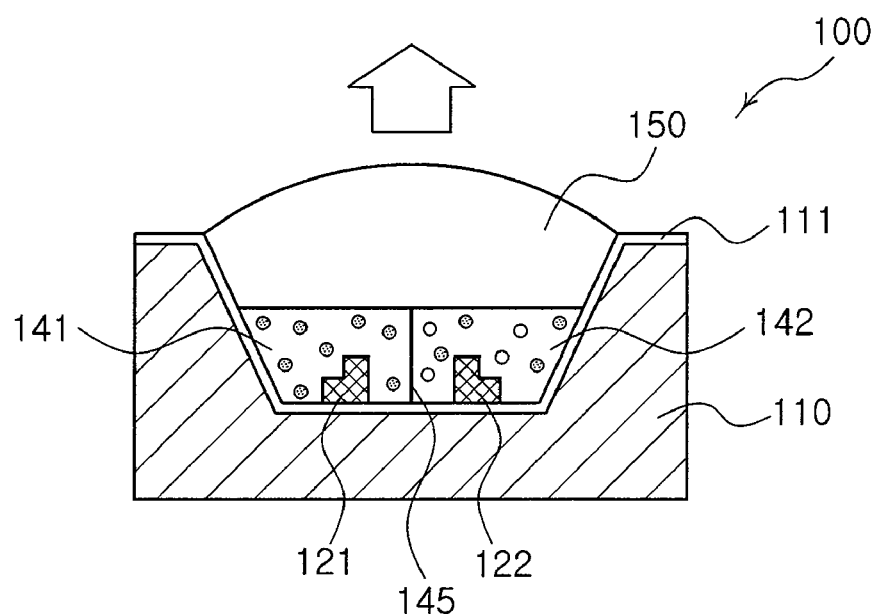
FIG. 2B is a cross-sectional view illustrating a cross-section taken along the line A-A of the white light emitting device shown in FIG. 2A.

FIG. 2A is a plane view illustrating a white light emitting device according to a first exemplary embodiment of the present invention. FIG. 2B is a cross-sectional view illustrating the white light emitting device, shown in FIG. 2A, taken along the line A-A.

A white light emitting device 100 according to a first exemplary embodiment of the invention includes a package body 110, such as a printed circuit board; at least two LED chips 121 and 122, first and second molding units 141 and 142, and a mold lens unit 150. The LED chips 121 and 122 are mounted within the interior space of the package body 110 and emit excitation light. The first and second molding units 141 and 142 include phosphors that absorb the excitation light and emit wavelength-converted light according to the LED chips 121 and 122, and mold the LED chips 121 and 122, respectively. The mold lens unit 150 is located above the first and second molding units 141 and 142 and scatters the wavelength-converted light in the first and second molding units 141 and 142 to emit the scattered light to the outside. Here, the interior space of the package body 110 within which the two LED chips 121 and 122 are mounted has a reflective layer 111 formed along the bottom thereof, which reflects the excitation light and the wavelength-converted light to emit the light to the outside.

Further, a reflective film 145 formed of high reflectivity metal may be formed at the boundary between the first and second molding units 141 and 142 in order to prevent wavelength-converted light generated from the first molding unit 141 and wavelength-converted light from the second molding unit 142 from being made incident to each other. A lead frame or a bonding wire that are connected to the reflective layer 111 may be included to electrically connect the LED chips 121 and 122 to an external power source.

Each of the two LED chips 121 and 122, that is, each of the first LED chip 121 and the second LED chip 122 is an LED chip that generates UV (ultraviolet) excitation light and is mounted within the interior space of the package body 110.

The first and second LED chips 121 and 122 may be electrically connected to the external power source by the lead frame or the bonding wire.

The first molding unit 141 and the second molding unit 142 correspond to the first LED chip 121 and the second LED chip 122, respectively, and are molding regions that include predetermined phosphors. For example, as shown in FIG. 2B, the first molding unit 141 may include a phosphor for converted red light and the second molding unit 142 may be a phosphor for converted green light and a phosphor for converted blue light. At this time, the first molding unit 141 that includes the phosphor for converted red light and the second molding unit 142 may be formed at a ratio of 4:6 to adjust a mixing ratio of the converted light for white-light emission. The first molding unit 141 and the second molding unit 142 may be formed at a ratio of 1:1 instead of 4:6 to form a mixing ratio of the converted light for white-light emission.

In the phosphors included in the first molding unit 141 and the second molding unit 142, examples of the phosphor for converted red light that is included in the first molding unit 141 may include i) rare earth oxide, sulfide, and nitride-based phosphors and ii) semiconductor nitride, sulfide, oxide, and phosphide-based phosphors. Specifically, examples of the i) rare earth oxide, sulfide, and nitride-based phosphors may include $CaAlSiN_3:Eu^{2+}$, $(Sr_X,Ca_{1-X})AlSiN_3:Eu^{2+}(0 \leq x \leq 1)$, $Sr_3SiO_5:Eu^{2+}$, $(Sr_X,Ca_{1-X})_2SiO_4:Eu^{2+}$, $(Sr_X,Ca_{1-X})AlSiN_yO_{1-y}(0 \leq x \leq 1)$ $MS:Eu^{2+}(M=Ca,Sr,Ba)$, $M_2O_{3-X}S_X:Eu^{3+}$ $(1 \leq x \leq 3$, $M=Y,Gd,La)$, $(Y,Lu,Sc,La,Gd,Sm)_3(Al,Ga,In)_5)_{12}:Ce$, and $(Y,Ca,Sr)_3(Al,Ga,Si)_5(O,S)_{12}:(Ce, Tb)$. Examples of the ii) semiconductor nitride, sulfide, oxide, and phosphide-based phosphors may include $Zn_{1-X}Cd_XS_ySe_{1-y}$ $(0 \leq x \leq 1, 0 \leq y \leq 1)$, $Zn_{1-X}Cd_XS_yO_{1-y}(0 \leq x \leq 1, 0 \leq y \leq 1)$, $Al_{1-X-y}Ga_XIn_yN(0 \leq x \leq 1, 0 \leq y \leq 1)$, and $Al_{1-X-y}Ga_XIn_yP$ $(0 \leq x \leq 1, 0 \leq y \leq 1)$.

Therefore, the first molding unit 141 that includes the i) rare earth oxide, sulfide, and nitride-based phosphors and the ii) semiconductor nitride, sulfide, oxide, and phosphide-based phosphors may be separated from the second molding unit 142 that includes phosphors for the converted blue light and the converted green light by using the reflective film 145, shown in FIG. 2B, formed at the boundary therebetween.

Further, the first molding unit 141 and the second molding unit 142 are separated from each other and formed at a predetermined ratio to adjust a mixing ratio of the converted light generated from the first molding unit 141 and the converted light generated from the second molding unit 142 for white-light emission.

The mold lens unit 150 is formed of resin for a lens. The mold lens unit 150 may be formed by including a transparent polymer or an optically transparent scatterer (not shown) in the inside adjacent to the first molding unit 141 and the second molding unit 142. The scatterer is an optically transparent polymer or an optically transparent glass bead. The scatter may be one material selected from the group consisting of optical glass, silica, talc, zirconium, a zinc oxide, and a titanium dioxide, or a combination thereof.

As such, since the first molding unit 141 is separated from the second molding unit 142, it is possible to prevent the phosphor for the converted red light of the first molding unit 141 from resorbing the light generated from the second molding unit 142, thereby improving white luminous efficiency.

Hereinafter, a white light emitting device according to a second exemplary embodiment of the invention will be described with reference to FIG. 3. Since a structure of the white light emitting device 200 according to the second exemplary embodiment of the invention that is similar to that of the white light emitting device 100 according to the first exemplary embodiment of the invention, a description thereof will be omitted.

Figure 3:
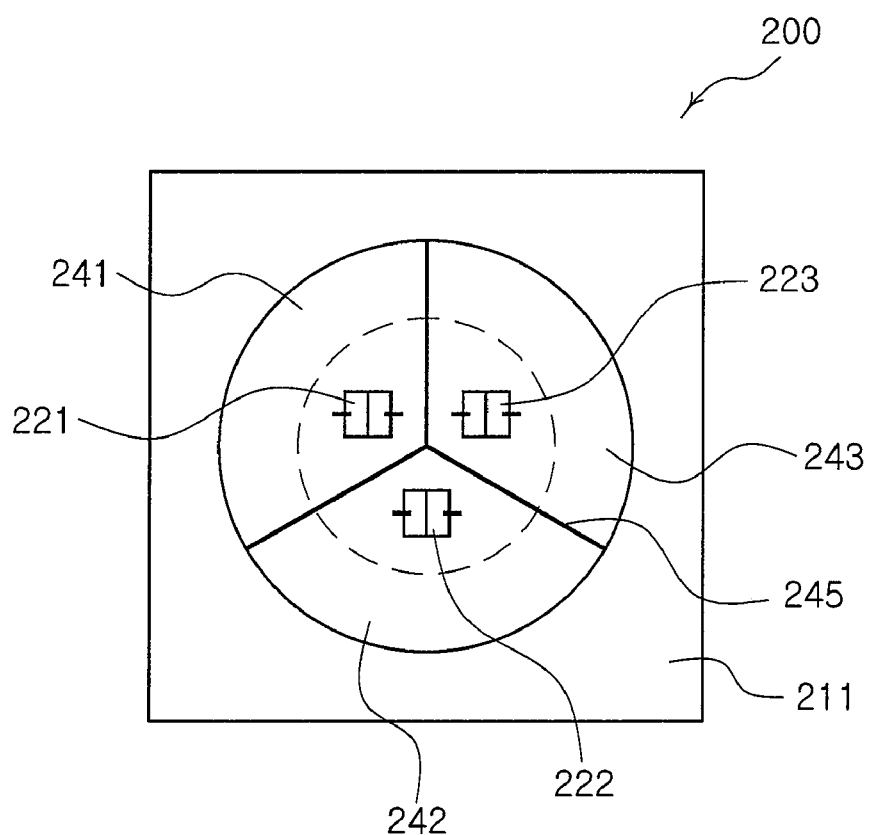
FIG. 3 is a plane view illustrating a white light emitting device according to a second exemplary embodiment of the present invention.

As shown in FIG. 3, the white light emitting device 200 according to the second exemplary embodiment of the invention has a similar structure to the white light emitting device 100 according to the first exemplary embodiment of the invention. The white light emitting device 200 includes a package body, such as a printed circuit board, LED chips 221, 222, and 223, a first molding unit 241, a second molding unit 242, and a third molding unit 243, and a mold lens unit (not shown). The LED chips 221, 222, and 223 are mounted within the interior space of the package body and generate excitation light. The first molding unit 241, the second molding unit 242, and the third molding unit 243 include predetermined phosphors that absorb the excitation light to generate wavelength-converted light according to the LED chips 221, 222, and 223, and mold the LED chips 221, 222, and 223, respectively. The mold lens unit is located above the first to third molding units 241, 242, and 243 and scatters the wavelength-converted light generated by the first to third molding units 241, 242, and 243 by using a scatterer, such as an optically transparent polymer or an optically transparent glass bead, to emit the scattered light to the outside.

The white light emitting device 200 according to the secondary exemplary embodiment of the invention includes a first molding unit 241 that includes a phosphor for converted red light, a second molding unit 242 that includes a phosphor for converted blue light, and a third molding unit 243 that includes a phosphor for converted green light. Like the white light emitting device 100 according to the first exemplary embodiment, examples of the phosphor for converted red light included in the first molding unit 241 may include i) rare earth oxide, sulfide, and nitride-based phosphors and ii) semiconductor nitride, sulfide, oxide, and phosphide-based phosphors. Specifically, examples of the i) rare earth oxide, sulfide, and nitride-based phosphors may include $CaAlSiN_3$:$Eu^{2+}$, $(Sr_X,Ca_{1-X})AlSiN_3$:$Eu^{2+}$($0 \leq x \leq 1$), $Sr_3SiO_5$:$Eu^{2+}$, $(Sr_X,Ca_{1-X})_2SiO_4$:$Eu^{2+}$, $(Sr_X,Ca_{1-X})AlSiN_yO_{1-y}$($0 \leq x \leq 1$), MS:$Eu^{2+}$(M=Ca,Sr,Ba), $M_2O_{3-x}S_x$:$Eu^{3+}$($1 \leq x \leq 3$, M=Y,Gd,La), $(Y,Lu,Sc,La,Gd,Sm)_3(Al,Ga,In)_5)_{12}$:Ce, and $(Y,Ca,Sr)_3(Al,Ga,Si)_5(O,S)_{12}$:(Ce, Tb). Examples of the ii) semiconductor nitride, sulfide, oxide, and phosphide-based phosphors may include $Zn_{1-x}Cd_xS_ySe_{1-y}$($0 \leq x \leq 1$, $0 \leq y \leq 1$), $Zn_{1-x}Cd_xS_yO_{1-y}$($0 \leq x \leq 1$, $0 \leq y \leq 1$), $Al_{1-x-y}Ga_xIn_yN$($0 \leq x \leq 1$, $0 \leq y \leq 1$), and $Al_{1-x-y}Ga_xIn_yP$($0 \leq x \leq 1$, $0 \leq y \leq 1$).

Further, the first molding unit 241 that includes the phosphor for converted red light, the second molding unit 242 that includes the phosphor for converted blue light, and the third molding unit 243 that includes the phosphor for converted green light are formed at a ratio of 1:1:1 by a reflective film 245 formed at the boundary therebetween. It is possible to prevent the phosphor for converted red light of the first molding unit 241 from resorbing the light generated from the second and third molding units 242 and 243 to thereby improve white luminous efficiency. Alternatively, a mixing ratio of the converted light for white-light emission is adjusted to control color rendering and color temperature.

Figure 4:
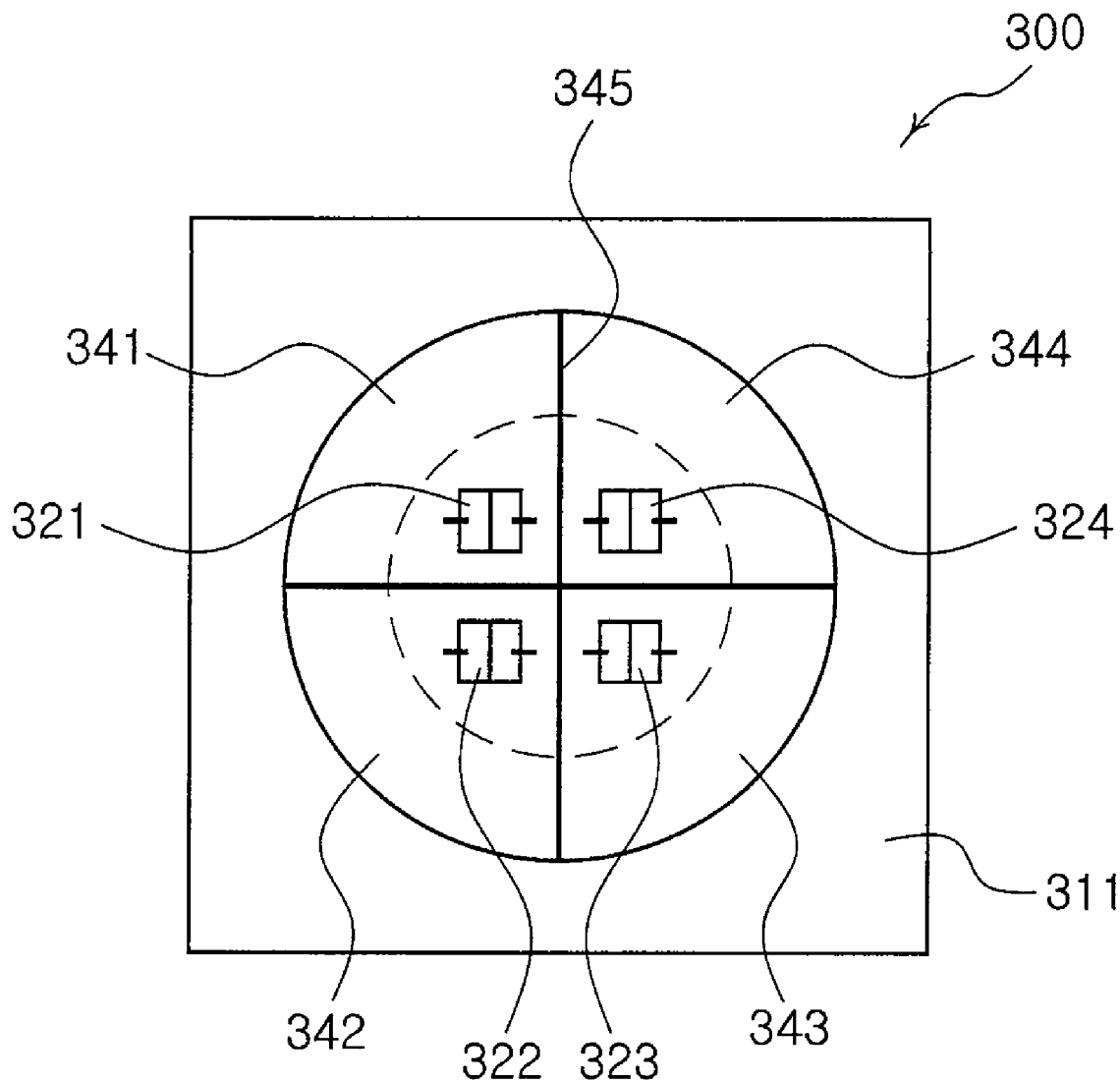
FIG. 4 is a plane view illustrating a white light emitting device according to a third exemplary embodiment of the present invention.

A white light emitting device according to a third exemplary embodiment of the invention, shown in FIG. 4, will now be described. As shown in FIG. 4, the light emitting device 300 according to the third exemplary embodiment includes a package body (not shown), such as a printed circuit board, four LED chips 321, 322, 323, and 324, first to fourth molding units 341, 342, 343, and 344, and a mold lens unit (not shown). The four LED chips 321, 322, 323, and 324 are mounted within the interior space of the package body and generate excitation light. The first to fourth molding units 341, 342, 343, and 344 include predetermined phosphors that absorb excitation light to generate wavelength-converted light according to the LED chips 321, 322, 323, and 324, and mold the LED chips 341, 342, 343, and 344, respectively. The mold lens unit is located above the first to fourth molding units 341, 342, 343, and 344 and scatters the wavelength-converted light generated by the first to fourth molding units 341, 342, 343, and 344 by using a scatterer, such as an optically transparent polymer or an optically transparent glass bead, to emit the scattered light to the outside.

The white light emitting device 300 according to the third embodiment of the invention, shown in FIG. 4, includes the first molding unit 341 and the third molding unit 343, each of which includes the phosphor for converted red light, the second molding unit 342 that includes the phosphor for converted blue light and the third molding unit 344 that includes the phosphor for converted green light, which are separated from each other by, for example, a reflective film 345 formed at the boundary therebetween. The first to fourth molding units 341 to 344 equally divide the entire molding area. Here, the present invention is not limited to the first to fourth molding units 341, 342, 343, and 344. The number of molding units may be determined according to the number of LED chips mounted. Further, the phosphor for converted red light is not included in each of the first molding unit 341 and the third molding unit 343 but in at least one or two molding unit selected from the first to fourth molding units 341, 342, 343, and 344.

As described above, examples of the phosphor for converted red light that is included in each of the first molding unit 341 and the third molding unit 343 in the white light emitting device 300 according to the third exemplary embodiment of the invention, shown in FIG. 4, may include i) rare earth oxide, sulfide, and nitride-based phosphors and ii) semiconductor nitride, sulfide, oxide, and phosphide-based phosphors. Specifically, examples of the i) rare earth oxide, sulfide, and nitride-based phosphors may include $CaAlSiN_3$:$Eu^{2+}$, $(Sr_X,Ca_{1-X})AlSiN_3$:$Eu^{2+}$($0 \leq x \leq 1$), $Sr_3SiO_5$:$Eu^{2+}$, $(Sr_X,Ca_{1-X})_2SiO_4$:$Eu^{2+}$, $(Sr_X,Ca_{1-X})AlSiN_yO_{1-y}$($0 \leq x \leq 1$), MS:$Eu^{2+}$(M=Ca,Sr,Ba), $M_2O_{3-x}S_x$:$Eu^{3+}$($1 \leq x \leq 3$, M=Y,Gd,La), $(Y,Lu,Sc,La,Gd,Sm)_3(Al,Ga,In)_5)_{12}$:Ce, and $(Y,Ca,Sr)_3(Al,Ga,Si)_5(O,S)_{12}$:(Ce, Tb). Examples of the ii) semiconductor nitride, sulfide, oxide, and phosphide-based phosphors may include $Zn_{1-x}Cd_xS_ySe_{1-y}$($0 \leq x \leq 1$, $0 \leq y \leq 1$), $Zn_{1-x}Cd_xS_yO_{1-y}$($0 \leq x \leq 1$, $0 \leq y \leq 1$), $Al_{1-x-y}Ga_xIn_yN$($0 \leq x \leq 1$, $0 \leq y \leq 1$), and $Al_{1-x-y}Ga_xIn_yP$($0 \leq x \leq 1$, $0 \leq y \leq 1$).

Therefore, it is possible to prevent the phosphor for converted red light included in each of the first molding unit 341 and the third molding unit 343 from resorbing light generated from the second and fourth molding units 342 and 344 to improve white luminous efficiency. Alternatively, a mixing ratio of the converted light for white-light emission is adjusted to control rendering and color temperature.

As set forth above, according to exemplary embodiments of the invention, i) rare earth oxide, sulfide, and nitride-based phosphors and ii) semiconductor nitride, sulfide, oxide, and phosphide-based phosphors are used as phosphors for converted red light, and the phosphor for the converted red light is prevented from resorbing light generated from the other molding units to improve white-light emission. A mixing ratio of the converted light for white luminous efficiency is adjusted to control color rending and color temperature.

While the present invention has been shown and described in connection with the exemplary embodiments, it will be apparent to those skilled in the art that modifications and variations can be made without departing from the spirit and scope of the invention as defined by the appended claims.

What is claimed is:

1. A white light emitting device comprising:
    a package body having a recess;
    at least two LED chips mounted within the recess of the package body and emitting excitation light;
    at least two molding units formed in the recess of the package body, each of the molding units being located in divided areas of the recess of the package body according to the at least two LED chips and molding each of the LED chips, respectively, wherein each of the molding units include phosphors, absorbing the excitation light and emitting wavelength-converted light, respectively;
    a reflective film formed of high-reflective metal at a boundary between the molding units and dividing the molding units in the recess of the package body; and
    a mold lens unit provided above the molding units and the reflective film, and scattering the wavelength-converted light to emit the scattered light to the outside.

2. The white light emitting device of claim 1, wherein at least one of the regions of the molding unit comprises a phosphor for converted red light, and
    the phosphor for the converted red light is a rare earth oxide, sulfide, or nitride-based phosphor that is any one selected from the group consisting of $aAlSiN_3:Eu^{2+}$, $(Sr_x,Ca_{1-x})AlSiN_3:Eu^{2+}(0 \leq x \leq 1)$, $Sr_3SiO_5:Eu^{2+}$, $(Srx,Ca_{1-x})_2SiO_4:Eu^{2+}$, $(Sr_x,Ca_{1-x})AlSiN_yO_{1-y}(0 \leq x \leq 1)$, $MS:Eu^{2+}(M=Ca,Sr,Ba)$, $M_2O_{3-x}Sx:Eu^{3+}(1 \leq x \leq 3, M=Y,Gd,La)$, $Y,Lu,Sc,La,Gd,Sm)_3(Al,Ga,In)_5)_{12}:Ce$, and $(Y,Ca,Sr)_3(Al,Ga,Si)_5(O,S)_{12}:(Ce, Tb)$, or a combination thereof.

3. The white light emitting device of claim 1, wherein at least one of the regions of the molding unit comprises a phosphor for converted red light, and
    the phosphor for the converted red light is a semiconductor nitride, sulfide, oxide, or phosphide-based phosphor that is any one selected from the group consisting of $Zn_{1-x}Cd_xS_ySe_{1-y}(0 \leq x \leq 1, 0 \leq y \leq 1)$, $Zn_{1-x}Cd_xS_yO_{1-y}(0 \leq x \leq 1, 0 \leq y \leq 1)$, $Al_{1-x-y}Ga_xIn_yN((0 \leq x \leq 1, 0 \leq y \leq 1)$, and $Al_{1-x-y}Ga_xIn_yP((0 \leq x \leq 1, 0 \leq y \leq 1)$, or a combination thereof.

4. The white light emitting device of claim 1, wherein the molding unit comprises a first molding unit including a phosphor for converted red light and a second molding unit including phosphors for converted blue light and converted green light.

5. The white light emitting device of claim 1, wherein the molding unit comprises the phosphors, and
    the phosphors include a phosphor for converted red light.

6. The white light emitting device of claim 1, wherein the mold lens unit comprises a plurality of optically transparent scatterers scattering the wavelength-converted light, and
    the scatterer is any one material selected from the group consisting of optical glass, silica, talc, zirconium, a zinc oxide, and a titanium dioxide, or a combination thereof.

7. The white light emitting device of claim 1, wherein each of the at least two molding units occupies one of vertically divided areas of the recess.

8. The white light emitting device of claim 7, wherein the vertically divided areas of the recess have a predetermined ratio between the divided areas such that converted light from the at least two molding units have the predetermined ratio with each other.

* * * * *